(12) United States Patent
König et al.

(10) Patent No.: US 11,360,119 B2
(45) Date of Patent: Jun. 14, 2022

(54) CONTACT PIN, IN PARTICULAR SPRING CONTACT PIN

(71) Applicant: FEINMETALL GMBH, Herrenberg (DE)

(72) Inventors: Christian König, Filderstadt (DE); Jörg Burgold, Herrenberg (DE); Gunnar Volkmann, Mörfelden-Walldorf (DE); Mark-Daniel Flik, Rohrdorf (DE)

(73) Assignee: FEINMETALL GMBH, Herrenberg (DE)

( * ) Notice: Subject to any disclaimer, the term of this patent is extended or adjusted under 35 U.S.C. 154(b) by 509 days.

(21) Appl. No.: 16/332,380

(22) PCT Filed: Sep. 14, 2017

(86) PCT No.: PCT/EP2017/073179
§ 371 (c)(1),
(2) Date: Mar. 12, 2019

(87) PCT Pub. No.: WO2018/050767
PCT Pub. Date: Mar. 22, 2018

(65) Prior Publication Data
US 2021/0293852 A1    Sep. 23, 2021

(30) Foreign Application Priority Data
Sep. 14, 2016 (DE) .................. 10 2016 217 563.7

(51) Int. Cl.
 G01R 1/067 (2006.01)
(52) U.S. Cl.
 CPC ................ G01R 1/06722 (2013.01)

(58) Field of Classification Search
 CPC .... G01R 1/06722; G01R 3/00; G01R 31/288; G01R 1/07314; H01L 2224/16; H01L 2224/48463; H01L 2924/00
(Continued)

(56) References Cited

U.S. PATENT DOCUMENTS 6,317,311 B1 * 11/2001 Middlehurst .......... H02B 1/056
 361/637
6,956,362 B1 10/2005 Campbell et al.
(Continued)

FOREIGN PATENT DOCUMENTS

| DE | 20315894 U1 | 12/2003 |
|---|---|---|
| DE | 102011102791 A1 | 11/2012 |
| EP | 2278866 B1 | 5/2012 |

OTHER PUBLICATIONS

International Search Report and Written Opinion issued in PCT/EP2017/073179, dated Mar. 28, 2019.
(Continued)

*Primary Examiner* — Douglas X Rodriguez
*Assistant Examiner* — Trung Q Nguyen
(74) *Attorney, Agent, or Firm* — Harness, Dickey & Pierce, P.L.C.; Stephen T. Olson

(57) ABSTRACT

A contact pin, in particular a spring contact pin, comprising a test head for contacting an electrically conductive contact surface of a test object, in particular a wafer, a printed circuit board or the like, and comprising a pin sleeve, in which the test head is mounted with a guide end in a longitudinally displaceable manner. At least in some sections, a flexible, deformable/deformed circuit carrier is provided, on which at least one electrical/electronic component is arranged and which is or can be axially inserted into the pin sleeve by rolling and/or folding.

17 Claims, 8 Drawing Sheets

Figure 1:
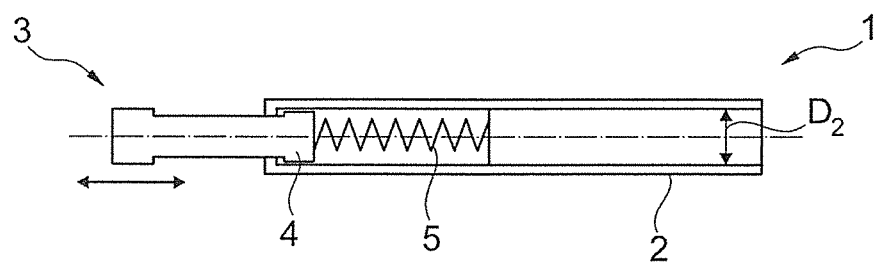

(58) Field of Classification Search
USPC ...... 324/754.1, 500, 754.03, 754.01, 754.13,
324/754.14, 756.03, 756.04, 757.4,
324/757.05, 754.2
See application file for complete search history.

(56) References Cited

U.S. PATENT DOCUMENTS

| | | | |
|---|---|---|---|
| 2013/0057308 A1* | 3/2013 | Yano | G01R 3/00 |
| | | | 324/755.01 |
| 2014/0266278 A1 | 9/2014 | Yeh | |
| 2016/0178665 A1 | 6/2016 | McGrath, Jr. et al. | |

OTHER PUBLICATIONS

International Search Report (in English and German) and Written Opinion (in German) issued in PCT/EP2017/073179, dated Jan. 4, 2018; ISA/EP.

* cited by examiner

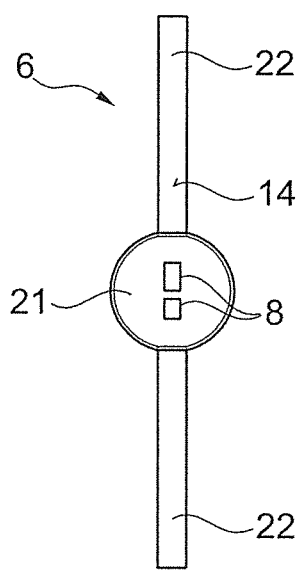
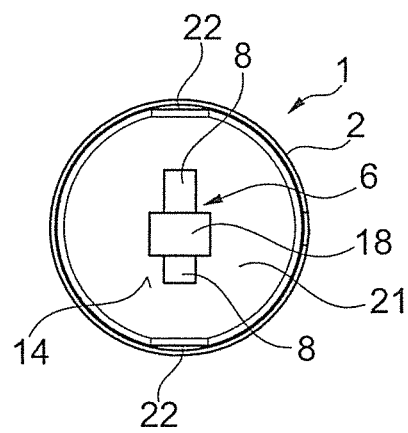
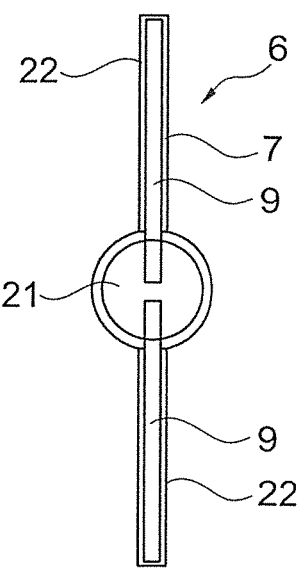
Fig. 9A  Fig. 9C  Fig. 9B
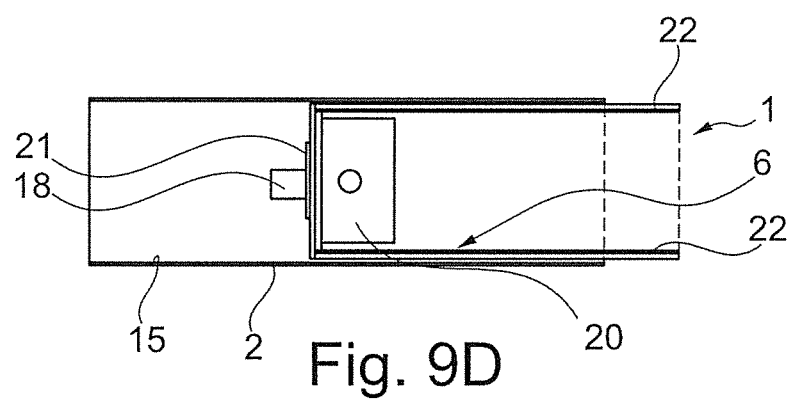
Fig. 9D
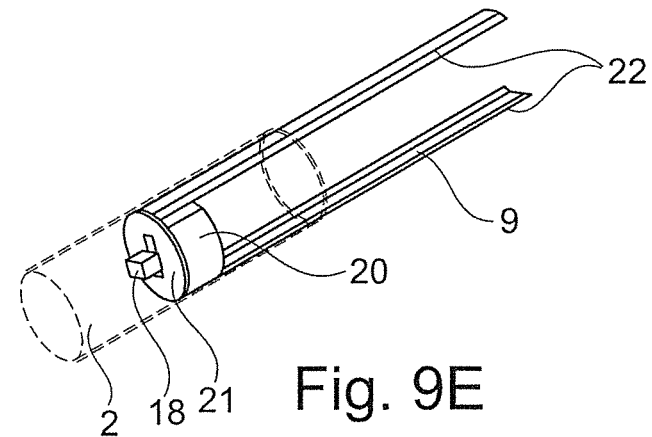
Fig. 9E

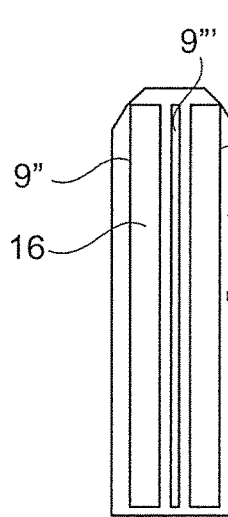
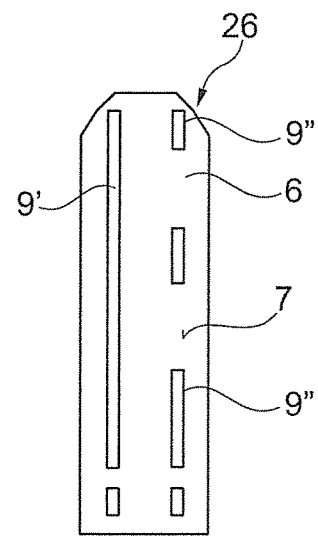
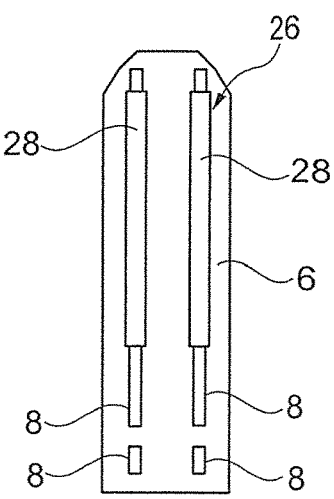
Fig. 12A  Fig. 12B  Fig. 12C
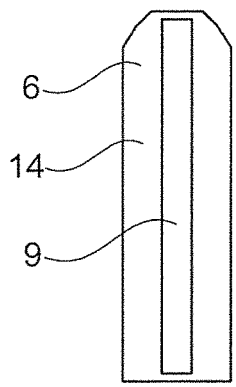
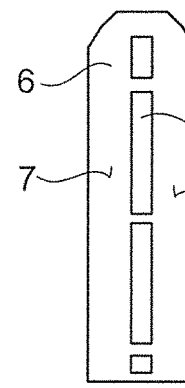
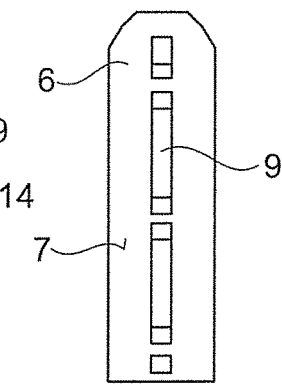
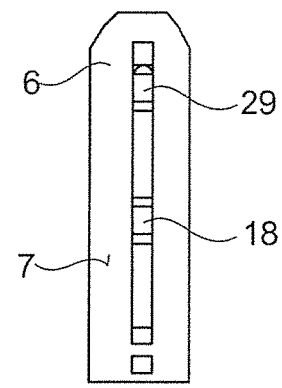
Fig. 13A  Fig. 13B  Fig. 13C  Fig. 13D
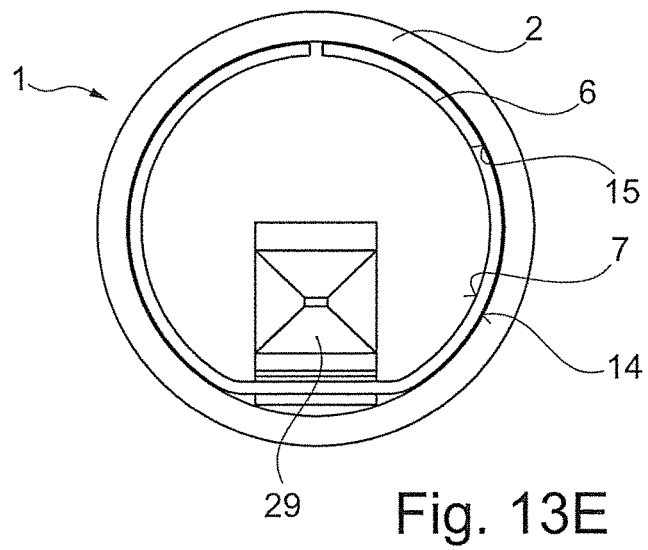
Fig. 13E

CONTACT PIN, IN PARTICULAR SPRING CONTACT PIN

CROSS-REFERENCE TO RELATED APPLICATIONS

This application is a 371 U.S. National Stage of International Application No. PCT/EP2017/073179, filed Sep. 14, 2017, which claims priority to German Patent Application No. 10 2016 217 563.7, filed Sep. 14, 2016. The entire disclosures of the above applications are incorporated herein by reference.

The invention relates to a contact pin, in particular a spring contact pin, comprising a test head for contacting an electrically conductive contact surface of a test object, in particular a printed circuit board, a plug device or the like, and comprising a pin sleeve, in which the test head is mounted with a guide end in a longitudinally displaceable manner.

Contact pins and spring contact pins of the type mentioned above are already known from the prior art. Usually, spring contact pins have a circular cylindrical pin sleeve, also known as a jacket, which has a round or circular cross-section and in which a test head for electrical contacting of a test object is mounted in an axially displaceable manner. To this end, the test head has a guide end which projects axially into the pin sleeve and is mounted axially displaceable or longitudinally displaceable in the pin sleeve. The guide end is held captive in the pin sleeve, for example by a flanged edge at one end of the pin sleeve, and is preferably pretensioned in the direction of this end by a spring element arranged in the pin sleeve, in particular a coil spring, so that the contact head is forced out of the pin sleeve. To contact the test piece, the spring contact pin is moved towards the test piece until the test head hits the contact surface of the test piece to be contacted. The fact that the test head is displaceably mounted in the pin sleeve has the advantage that the test head can spring deflect. This ensures that all electrical contact surfaces of the test object can be reliably contacted in a test device with a large number of such contact pins.

However, the round cross-section makes it difficult to use electrical/electronic components in the pin sleeve, which could increase the functional scope of the contact pin. For example, it is not easily possible to mount components or structures that are used for mounting flat substrates or printed circuit boards also in a contact pin.

The invention is therefore based on the object to create a contact pin, in particular a spring contact pin, which also enables conventional electrical/electronic components to be mounted on or in the contact pin in a simple manner.

The object underlying the invention is solved by a contact pin with the features of claim 1. It has the advantage that the components can be mounted in the conventional way on a flat circuit carrier before the circuit carrier is mounted in the pin sleeve, whereby the circuit carrier is then deformed in order to be inserted advantageously into the pin sleeve. In accordance with the invention, this is achieved by arranging the component, which can also be an electrically conductive structure, on a circuit carrier, which is flexible at least in sections and which is manufactured in particular from an electrically insulating or non-conductive plastic, the circuit carrier being axially inserted/insertable into the pin sleeve by rolling and/or folding. The final shape of the circuit carrier is therefore only produced after it has been assembled with at least one component, so that the component can be assembled in the conventional way, as can be done on a flat printed circuit board. Due to the at least sectionally flexible design of the circuit carrier, it can be rolled and/or folded into the desired shape after assembly of the respective component and thus simply inserted axially into the pin sleeve. This makes it easy and inexpensive to arrange the component in the pin sleeve.

According to one preferred further development of the invention, it is provided that the circuit carrier at least in sections has an inherent elasticity, so that the circuit carrier is pretensioned against an inner side of the pin sleeve at least in certain areas by the inherent elasticity in the pin sleeve. The inherent elasticity ensures that the circuit carrier is radially braced within the pin sleeve, resulting in a secure locking and alignment of the circuit carrier within the pin sleeve. In particular, the projections ensure that the intended areas of the circuit carrier are always arranged at a distance from the inside of the normally electrically conductive pin sleeve, so that short circuits can be safely avoided. In addition, the pretensioning also makes it possible for the pin sleeve itself to be contacted safely electrically by the section of the circuit carrier pretensioned against the pin sleeve being electrically conductive or having an electrically conductive contact element.

In particular, it is provided that the circuit carrier has at least one electrically conductive contact surface, which is/can be pretensioned against the inside of the pin sleeve. In this way, the electrical connection from the circuit carrier and the electrical/electronic components arranged thereon to the test object is established in a simple manner by means of the pin sleeve and the test head of the contact pin. This results in a safe and simple electrical connection, which makes it possible to determine further information about the test object by means of the circuit carrier and the components arranged on it, or to carry out tests on the test object. In particular, the mechanical pretension ensures that the electrical contact is maintained permanently, even if vibrations or accelerations act on the contact pin.

According to one preferred further development of the invention, it is provided that the circuit carrier is rigid at least in sections, whereby the electrical/electronic component in particular is arranged on a rigid section. The circuit carrier is thus elastically deformable or flexible in sections and rigid in sections. This means that the circuit carrier has areas which are not deformed during rolling. In these rigid areas, the arrangement of the one or several electrical/electronic components is particularly advantageous, because the rigid design of the circuit carrier in this area means that the connection points between the component and the circuit carrier, in particular conductor tracks arranged on the circuit carrier, are not deformed and thus not loaded when the flexible areas are deformed. The circuit carrier is thus divided into carrier sections that are rigid and holding sections or contact sections that are flexible, in particular elastically deformable. According to a further embodiment, it is provided that the circuit carrier itself is not rigid, but is stiffened in sections by the arrangement of one or more components, in particular stiffening components, so that rigid sections are produced on the circuit carrier by components arranged thereon.

Furthermore, it is preferably provided that at least one rigid section of the circuit carrier is arranged/arrangeable at a distance from the inside of the pin sleeve. The circuit carrier is thus shaped in such a way that when it is transferred from the flat initial shape into the rolled or folded shape, in particular when it is inserted into the pin sleeve, the at least one rigid region is located at a distance from the inside, so that elements or components located thereon are preferably also located at a distance from the inside. This ensures that no unwanted short circuits to the jacket or pin sleeve occur between the components or the rigid areas of the circuit carrier during operation. In addition, the spaced-apart arrangement also ensures that components can be arranged on the respective section of the circuit carrier between the circuit carrier and the pin sleeve, in particular in such a way that no contact with the pin sleeve is established in order to avoid mechanical stress on the components.

According to one advantageous further development of the invention, it is also intended that the circuit carrier has an electrically insulating layer at least in certain areas on its surface facing the inside. This means that the circuit carrier is electrically insulated from the pin sleeve, at least in certain areas, so that it can lie against the inside of the pin sleeve in certain areas without creating an electrical connection. The electrically insulated regions of the circuit carrier which lie against the inside and which are pretensioned in particular against the pin sleeve thus serve solely to lock and fasten the circuit carrier in the pin sleeve. Between the insulating layer and the circuit carrier itself, one or more conductor tracks can run, which are protected by the electrically insulating layer against electrical contact with the pin sleeve. It is useful for the insulating layer to extend substantially over the entire surface of the circuit carrier and to be absent only at those locations where contact with the pin sleeve, components or other sections designed for electrical contacting is desired. The electrically insulating layer can, for example, be an insulation foil or a subsequently applied electrically insulating varnish, such as solder resist. It is also possible to apply the coating only where electrically conductive elements are present on the circuit carrier.

The coating can also provide mechanical support for the particularly rigid areas of the circuit carrier or, for example, define the rigid areas of the circuit carrier. The circuit carrier itself can therefore be homogeneous, with the rigid areas being formed by the insulating layer and/or the components or conductor tracks arranged on the circuit carrier.

Furthermore, it is preferably provided that the circuit carrier is rolled up/rollable or folded/foldable in a circular, triangular or S-shaped manner. Due to its flexibility, the circuit carrier can be rolled or folded into many different shapes. Depending on the desired range of functions, different shapes can present themselves. In particular, the shapes differ depending on the components used and their numbers relative to one another. Particularly in areas where a component is arranged on the surface or side surface of the circuit carrier facing the inner wall, the circuit carrier preferably deviates from the circular shape in order to provide the necessary space for the component between the circuit carrier and the pin sleeve. The triangular shape in particular allows several components to be arranged on the surface facing the inside of the pin sleeve or on the surface of the circuit carrier opposite the inside. In particular, it is provided that components are arranged on the circuit carrier solely for stiffening the circuit carrier, for example to determine its shape in the pin sleeve and to guarantee it permanently. Circular deformation is suitable, for example, for arranging several components on the outside and/or inside of the circuit carrier. In particular, a relatively large interior space is provided in which larger components can also be arranged. The triangular shape is particularly suitable for arranging a large number of components on the outside or on the surface of the circuit carrier facing the inside. The S-shaped design results in a central crosspiece which can be fitted with components on both sides.

In accordance with one preferred further development of the invention, it is provided that the circuit carrier has a circular, in particular rigid, carrier portion for the at least one component, from which at least one strip-shaped contact portion emanates, which is aligned/alignable by folding the circuit carrier perpendicularly to the carrier portion in order to lie at least substantially parallel to the longitudinal direction of the pin sleeve in the pin sleeve, and wherein the carrier portion has an outer diameter which is smaller than the inner diameter of the pin sleeve. The carrier section of the circuit carrier can thus be inserted into the pin sleeve in such a way that the carrier section is aligned perpendicular to the longitudinal center axis of the pin sleeve, i.e. extends radially in the pin sleeve. The carrier section thus forms an end face of the circuit carrier, on which one or more components can be arranged. This makes it easy, for example, to arrange a sensor as a component on the carrier section in the pin sleeve in such a way that the sensor senses axially or in the longitudinal direction of the pin sleeve, for example in the form of a non-contact distance sensor. The carrier section is preferably designed in such a way that a stiffening element is arranged on the side of the carrier section facing away from the sensor, whereby the stiffening element can also be an electrical/electronic component. Through the strip-shaped contact section, which is aligned perpendicular to the carrier section by folding, electrical contacting of the component arranged on the carrier section is also possible away from the carrier section in a simple manner. Two of the strip-shaped contact sections, which extend parallel and at a distance from each other in the pin sleeve and are each provided with an electrically conductive conductor track preferably emanate from the carrier section in order to electrically contact the component on the carrier section. At the free ends of the strip-shaped contact sections, these can each be electrically contacted to operate the component onto the carrier section.

The respective contact section expediently has at least one electrically conductive conductor track on its surface facing away from the inside of the pin sleeve. Thus, the respective conductor track faces the interior of the pin sleeve and is electrically insulated from the pin sleeve by the circuit carrier itself. This ensures a safe and simple guidance of the conductor track in the pin sleeve. Advantageously, the circuit carrier is folded/rolled in such a way that the contact sections are elastically pretensioned against the inside of the pin sleeve. This prevents the conductor tracks on the inside of the contact sections from coming into contact with each other. In addition, the pre-tensioning in the pin sleeve aligns and locks the carrier section advantageously.

According to one preferred further development of the invention, it is provided that the circuit carrier, in particular the respective strip-shaped contact section, forms a structure for a printed circuit board plug-in connection at a free, in particular unrolled/unfolded end. Thus, the contact section at its free end is particularly easy to make electrical contact with, for example, by attaching a corresponding contact plug to the contact section. Preferably the circuit carrier arranged in a circular, triangular or S-shaped manner in the pin sleeve also has at least one strip-shaped contact section, which in particular is not rolled or folded and forms the electrical connecting plug at its free end.

Furthermore, it is preferably provided that the circuit carrier has at least one first insertion chamfer, by means of which the circuit carrier is rolled, or is at least supported, during insertion into the pin sleeve. The insertion chamfer is conveniently formed at the end of the circuit carrier, which is first inserted into the pin sleeve. The circuit carrier, which is particularly flat in its initial form, thus has the first insertion chamfer at one end, which ensures that the circuit carrier is rolled up when it is inserted into the pin sleeve. This ensures a simple assembly of the circuit carrier, in which the circuit carrier is not given the desired final shape until it is inserted into the pin sleeve. This is particularly advantageous for a circuit carrier that is at least substantially arranged in a circular manner in the pin sleeve.

According to one preferred further development of the invention, it is provided that the pin sleeve has at least a second insertion chamfer, in particular a chamfer, at an axially open end through which the circuit carrier is/can be inserted into the pin sleeve. The second insertion chamfer on the pin sleeve facilitates the insertion and deformation of the circuit carrier. In particular, the second insertion chamfer is designed as a chamfer so that the pin sleeve has a cross-section widening towards the end at this end. This chamfer or insertion chamfer helps to center and align the circuit carrier with the pin sleeve when inserting the circuit carrier.

Furthermore, it is preferably provided that the circuit carrier for forming a switching contact pin or a linear potentiometer has at least one electrical contact track running in the longitudinal direction of the pin sleeve, which contact track is electrically contacted by a contact element displaceable in the pin sleeve by the test head in at least one sliding position of the test head relative to the pin sleeve. The contact element is thus displaced within the pin sleeve by the test head. For this purpose, the contact element is mechanically connected to the test head, especially to the guide end of the test head. In particular, it is intended that the guide end forms or at least contributes to forming the contact element. If the test head is loaded against the force of the spring element and shifted in the direction of the pin sleeve, so that the guide end is moved further into the pin sleeve, the contact element is moved along the contact track. Depending on the sliding position of the test head, the contact track is electrically contacted by the contact element. According to a first embodiment, the contact track is designed as an interrupted conductor track and has several spaced electrical contact sections which are separated from each other by electrically insulated sections. This way, a switching contact pin is easily realized, in which the contact element contacts an electrical contact section or an insulating section of the contact track depending on the sliding position of the test head. Alternatively, the contact track is preferably designed as a resistance track, which is permanently electrically contacted by the contact element. Depending on the sliding position, the electrical resistance of the contact track changes, making it easy to determine the sliding position of the test head.

Furthermore, it is preferably provided that the contact element has at least one spring element which prestresses an electrically conductive contact surface of the contact element radially for contacting the contact track. The spring element ensures that the contact surface is always pressed against the contact track and that contact between the contact element or contact surface and contact track is permanently ensured. The spring element can, for example, be a coil spring, cup spring or leaf spring. Preferably, the spring element itself forms the contact surface or is designed in one piece with it. This results in a compact design, which also facilitates the mounting of the contact pin. In particular, the spring element is arranged in a cross hole created in the guide end. In particular, the spring element protrudes from both sides of the cross hole and has one of the electrical contact surfaces at each of its ends, which contacts one contact track of the circuit carrier. In particular, the contact pin is designed in such a way that when the two contact tracks are electrically connected to each other by the spring element, an electrical circuit is closed, and when one of the contact surfaces meets an electrically insulated section, the electrical circuit is open or interrupted. This enables the function of a switching contact pin to be realized in a simple manner. Alternatively, the contact element is preferably designed as a rigid contact element, in particular as a ball grinder. The ball grinder is at least substantially a spherical element which can be displaced in the pin sleeve by the test head, possibly against the force of the spring element. For this purpose, the ball grinder is axially braced, for example, between the spring element and the test head. The ball grinder is in permanent contact with one or more contact tracks on the inside of the pin sleeve, which are provided in particular by the circuit carrier as described above. The permanent contact is realized in particular by the preload of the circuit carrier. For this design it is preferably provided that the strip-shaped contact sections comprising the contact track or tracks are elastically pretensioned towards each other in order to ensure permanent contact. This means that separate springs are not required and the rigid ball grinder can be used as a moving contact element.

Furthermore, it is preferably provided that the at least one electrical/electronic component is designed as an optoelectronic component, as an illuminant, sensor, switch and/or as an electrical resistor. The type and use of the respective component is variable and, due to the advantageous design of the contact pin, many different electrical/electronic components can be arranged and used in the contact pin. Depending on the requirements profile of the contact pin and its application, suitable components can be selected, which lead to different advantages and possibilities when using the contact pin.

The invention will be explained in detail below based on the figures.

Figure 2:
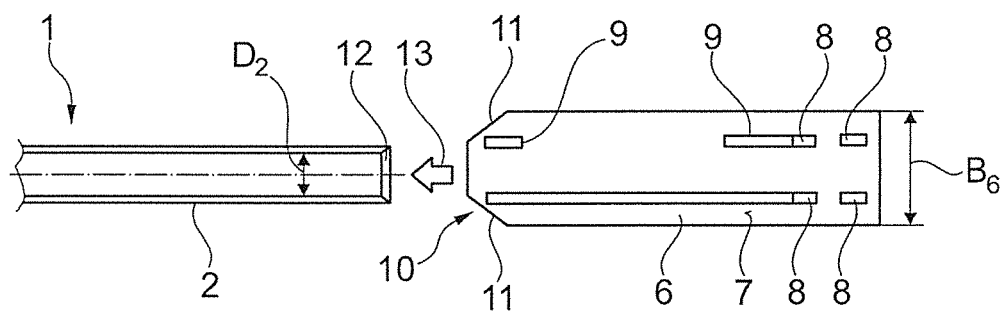
Figure 3:
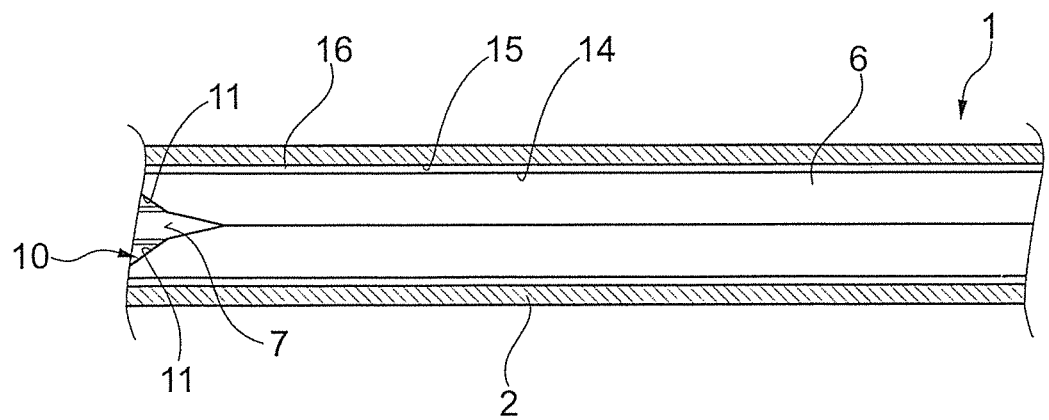
Figure 4:
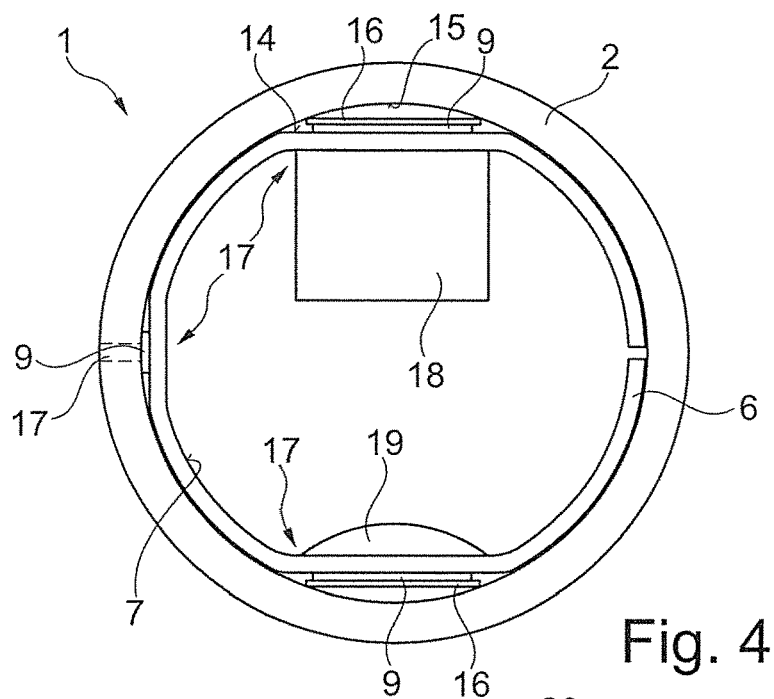
Figure 6A:
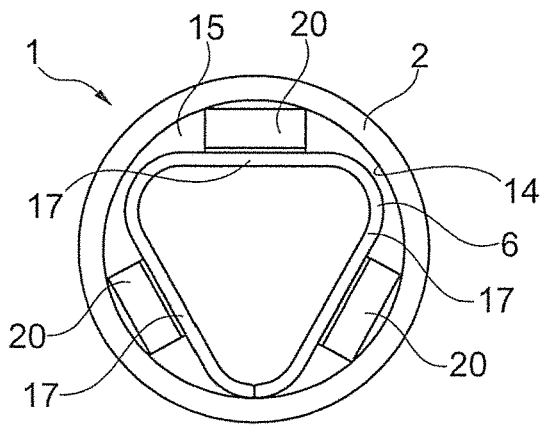
Figure 6B:
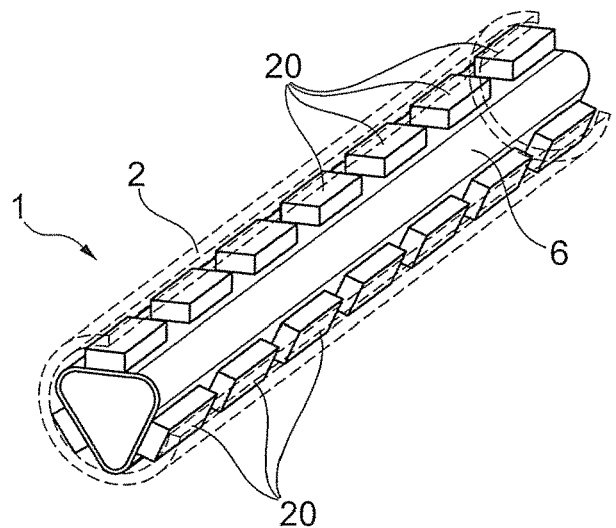
Figure 7:
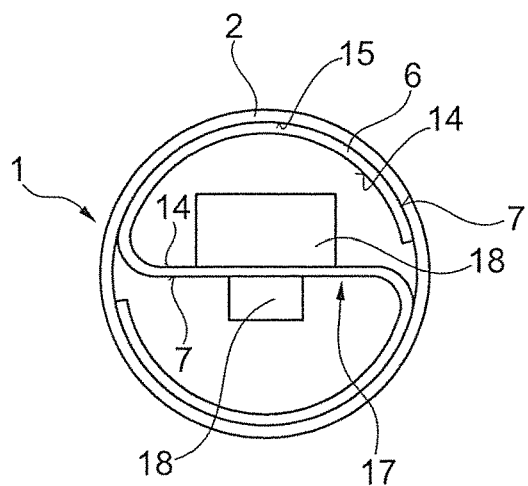
Figure 8A:
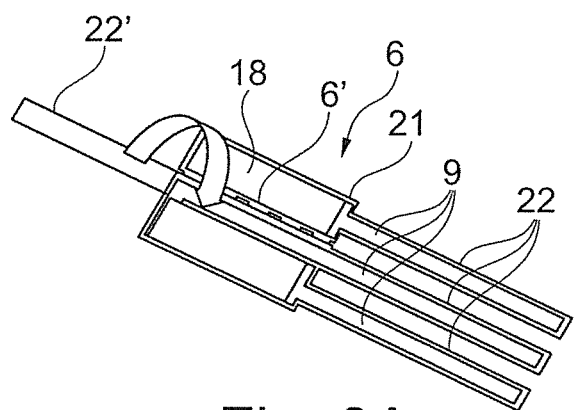
Figure 10A:
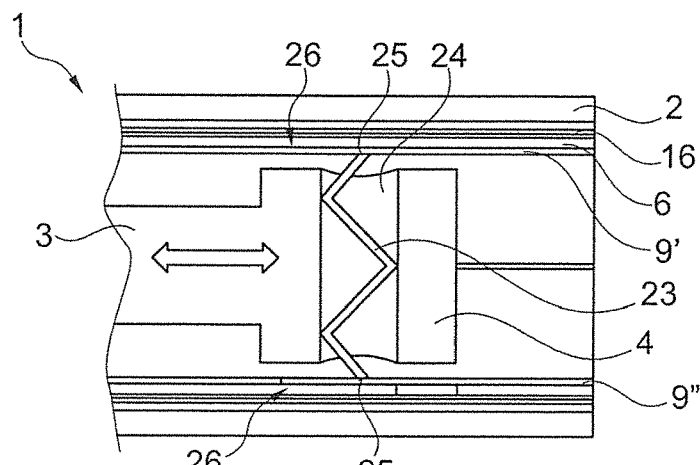
Figure 10B:
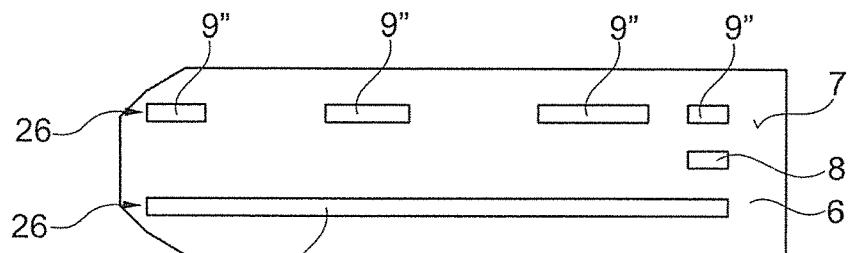
Figure 10C:
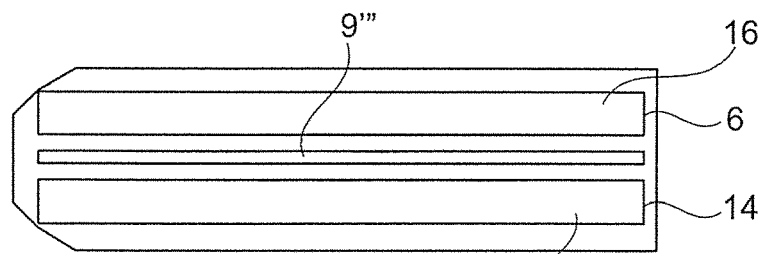
Figure 11:
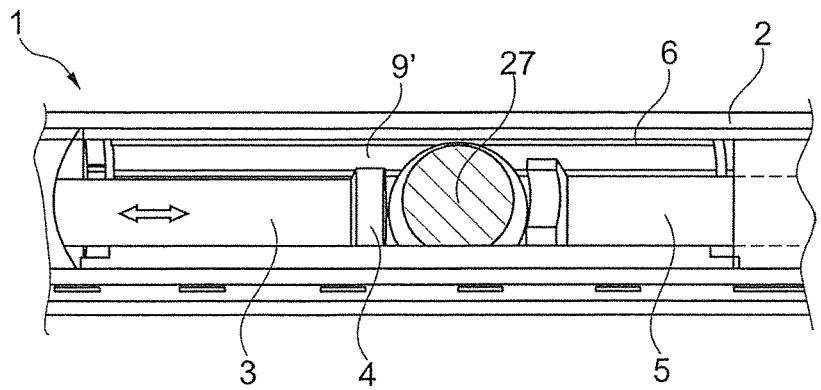

FIG. 1 shows a known spring contact pin in a longitudinal view,

FIG. 2 shows an advantageous further development of the spring contact pin with a flexible circuit carrier before assembly, FIG. 3 shows the spring contact pin with the flexible circuit carrier after mounting in a longitudinal sectional view, FIG. 4 shows the spring contact pin with the flexible cable carrier in a cross-sectional view, FIG. 5 shows spring contact pin with a further exemplary embodiment of the circuit carrier, FIG. 6 shows spring contact pin with a further exemplary embodiment of the circuit carrier, FIG. 7 shows spring contact pin with a further exemplary embodiment of the circuit carrier, FIG. 8 shows an advantageous design of the circuit carrier according to another exemplary embodiment, FIG. 9 shows a further exemplary embodiment of the spring contact pin, FIG. 10 shows a further exemplary embodiment of the spring contact pin as switching contact pin, FIG. 11 shows a further exemplary embodiment of the spring contact pin as switching contact pin, FIG. 12 shows an exemplary embodiment of the circuit carrier as linear potentiometer, FIG. 13 shows an exemplary embodiment of the spring contact pin with an illuminant, and FIG. 14 shows a further exemplary embodiment of the spring contact pin with the circuit carrier having a connector plug.

FIG. 1 shows in a simplified longitudinal section a spring contact pin 1, which is designed for contacting an electrically conductive contact surface of a test object not shown here. The test object can for example be a wafer, a printed circuit board or the like. The spring contact pin 1 has a circular cylindrical pin sleeve 2, in which a test head 3 for establishing contact with a guide end 4 is axially displaceably mounted. In addition, the spring force of a spring element 5 acts on the guide end 4, which is supported at one end by the test head 3 and at the other end by the pin sleeve 2, in order to push the guide head 3 axially out of the pin sleeve 2 at its free end. At the end opposite the test head 3, the pin sleeve 2 can be electrically connected to an evaluation circuit, so that electrical measurement signals can be acquired by the electrically conductive test head 3 and the electrically conductive pin sleeve 2. Thus, the contact between the test head 3 and the pin sleeve 2 ensures the electrical connection from the test object to the evaluation circuit.

As usual, the spring contact pin 1 has a circular cross-section. Due to the increasing functionality of electrical devices and the resulting necessary miniaturization of electronic components, smaller and smaller spring contact pins become necessary. Although the aim is to integrate electrical functions, such as sensory tasks or the like, into the spring contact pin 1, the circular cross-section is unfavorable for the integration of electrical/electronic components, and the pin sleeve, which is necessarily made of electrically conductive material, can hardly be avoided as a source of short-circuits with electrical/electronic components. The exemplary embodiments described in the following and the advantageous further development of the spring contact pin 1 solve these problems safely and cost-effectively.

In an enlarged detail view, FIG. 2 shows the end of the pin sleeve 2 facing away from the test head 3 as well as a circuit carrier 6 which must/can be inserted into the pin sleeve 2. The pin sleeve 2 has an inner diameter $D_2$, which is smaller than the width $B_6$ of the circuit carrier 6 before it is inserted into the pin sleeve 2. According to this exemplary embodiment, the circuit carrier 6 is designed as a flexible circuit carrier in a neutral or relaxed state prior to assembly in the form of a plate with several electrically conductive contact surfaces 8 and conductor tracks 9 on a first side surface 7. The height of the circuit carrier 6 is much smaller compared to its width $B_6$ and its length in order to obtain the plate-shaped design. Electrical/electronic components can be mounted and electrically contacted on the conductor tracks 9 and contact surfaces 8. Optionally, the conductor tracks 9 and contact surfaces 8 are also designed to be flexible or elastically deformable.

At one end face 10, the circuit carrier 6, which otherwise has a rectangular contour, has wedge-shaped insertion chamfers 11, which reduce the width $B_6$ towards the end face 10. The pin sleeve 2 also has an insertion chamfer 12 at its end facing away from the test head 3, which is in the form of a circumferential chamfer, which increases the diameter $D_2$ towards the end of the pin sleeve 2.

To mount the spring contact pin 1, the circuit carrier 6 is now inserted axially into the pin sleeve 2, as shown by an arrow 13. Advantageously, the width of the circuit carrier 6 at its narrowest point on the end face 10 is smaller than the largest inner diameter of the insertion chamfer 12, so that when the circuit carrier is inserted axially in the direction of its longitudinal axis into the pin sleeve 2, the insertion chamfers 11 and 12 meet. The circuit carrier 6 is inserted eccentrically into the pin sleeve 2, so that the insertion chamfers 12 and 11 cause the flexible, in particular elastically deformable circuit carrier 6 to be rolled up during insertion according to arrow 13.

To this end, FIG. 3 shows a longitudinal section of the pin sleeve 2 with the circuit carrier 6 rolled into it after assembly. The width $B_6$ of the circuit carrier 6 is selected in such a way that the longitudinal edges of the circuit carrier 6, when rolled up, lie opposite or against each other only at a small distance. Due to the advantageous inherent elasticity of the circuit carrier 6, its side face 14 facing away from the side face 7 contacts the inside 15 of the pin sleeve 2. In order to avoid direct electrical contact, at least one electrically insulating layer 16 is advantageously arranged or formed on the rear side or side surface 14 of the circuit carrier 6, which layer is shown cut in FIG. 3, so that the conductor tracks 9 or contact surfaces 8, which may extend to the rear side of the circuit carrier 6, are electrically insulated from the electrically conductive pin sleeve 2. Due to the advantageous design, the circuit carrier 6 can thus be mounted in a simple manner and, in particular, can be arranged in the pin sleeve 2 provided with electrical/electronic components, wherein, in particular through own elasticity, secure positioning of the circuit carrier 6 in the pin sleeve 2 as well as the supporting arrangement of the components within the pin sleeve 2 is guaranteed.

The circuit carrier 6 with one or more electrical/electronic components advantageously takes place in the flat state of the circuit carrier 6, as shown in FIG. 2. This allows the use of standardized placement methods, such as SMD placement or sealing layer technologies. The circuit carrier 6 preferably has a core of flexible plastic foil (polyamides), on which the conductor tracks 9 and contact surfaces 8, in particular of copper, which is optionally coated, are applied. Optionally, a solder resist can also be used as an additional electrical insulator and for easier, well-defined tinning of, for example, the SMD contact surfaces (8) or pads on the circuit carrier 6. The electrically insulating layer 16 can also be made of solder resist, for example.

While, according to this exemplary embodiment, the insertion chamfers 11 and 12 ensure easy rolling in when inserting the circuit carrier 6, it is of course also possible to design the circuit carrier without the insertion chamfers 11 and/or 12. In this case, however, it is necessary that the circuit carrier 6 is already rolled up/rolled into the form by a separate tool before insertion.

Thus, due to the inherent elasticity, a defined alignment of the circuit carrier 6 in the pin sleeve 2 as well as of the electronic components on it is guaranteed. If the circuit carrier 6, as described above, is made of plastic, the additional electrically insulating layer 16 can also be omitted, because an electrical contact to the pin sleeve 2 is then already prevented by the circuit carrier 6.

The circuit carrier 6 preferably has at least one rigid and at least one flexibly deformable or elastically deformable section. The actually flexible sections, on which electrically conductive elements, such as the conductor track 9 or contact surfaces 8, and/or a solder resist are applied, are also assumed to be rigid, because these sections are stiffened by the applied elements. Alternatively, it is also conceivable to form rigid sections during the production of the circuit carrier 6 itself, so that these are also rigid or stiff in comparison to other sections, regardless of the equipment of the circuit carrier 6. This deliberately creates sections or areas which do not deform due to their mechanical properties (stiffness) when the circuit carrier 6 is inserted into the pin sleeve 2. This ensures that components and/or elements located in these areas/sections are not subjected to additional mechanical stress during insertion. These areas/sections are therefore suitable for accommodating non-flexible components.

FIG. 4 shows a cross-sectional representation of the spring contact pin 1 in the region of the circuit carrier 6 mounted therein. In this exemplary embodiment, the circuit carrier 6 has several conductor tracks 9 on its side face 14 facing the inside 16 of the pin sleeve 2, which extend in the longitudinal direction of the circuit carrier or the pin sleeve 2. Two of the conductor tracks 9 are also provided with the electrically insulating layer 16, so that electrical contact between the external conductor tracks 9 and the electrically conductive pin sleeve 2 is reliably prevented. The conductor track 9 and the electrically insulating layer 16 lead to a stiffening of the circuit carrier 6, so that two at least essentially rigid sections 17 result in the circuit carrier 6, which are not deformed during insertion into the pin sleeve 2.

The third of the conductor tracks 9 is not provided with an electrically insulating layer 16, so that the conductor track 9 lies directly against the inside 15 of the pin sleeve 2. This creates an electrical contact between the circuit carrier 6 and the pin sleeve 2. Due to the elasticity of the circuit carrier 6, this conductor track 9 is also pressed radially outwards against the inside 15 of the pin sleeve 2, so that the electrical contact is maintained permanently. Optionally, an opening 17 (dashed line) is formed in the pin sleeve 2 in the area of the third conductor track 9, for example in the form of a radial hole, into which, for example, a solder can be introduced from outside for the material-locking connection of the third conductor track 9 and the pin sleeve 2. This would also additionally lock the circuit carrier 6 in the pin sleeve 2. The direct electrical contact between the third conductor track 9 and the pin sleeve 2 also ensures a good thermal connection between the circuit carrier 6 and the pin sleeve 2. Through the electrical contact, for example, a test signal/measurement signal from the test head 3 can be introduced directly into the circuit arranged on the circuit carrier 6.

The conductor tracks 9, which are provided with an electrically insulating layer 16 and are wider compared to the third conductor track 9, give rise to the fact that the rigid regions 17 of the circuit carrier 6 in the region of these conductor tracks 9 are also wider than in the region of the third conductor track 9. These flat regions result in advantageous sections of the circuit carrier 6 with a virtually stadium-shaped cross-section, in which electrical/electronic components 18 or passive components 19 can optionally be arranged. According to this exemplary embodiment, component 18 is an SMD component and component 19 is a thick-film electronic structure.

The conductor tracks 9 preferably have a thickness of less than 50 μm. If areas are to be created, in which the mechanical properties of such thin conductor tracks 9 are not sufficient, SMD technology can be used to apply additional stiffening elements 20 to the side surface 14 of the circuit carrier 6 facing the inside 15 of the pin sleeve 2, as shown in the exemplary embodiment of FIG. 5.

Figure 5A:
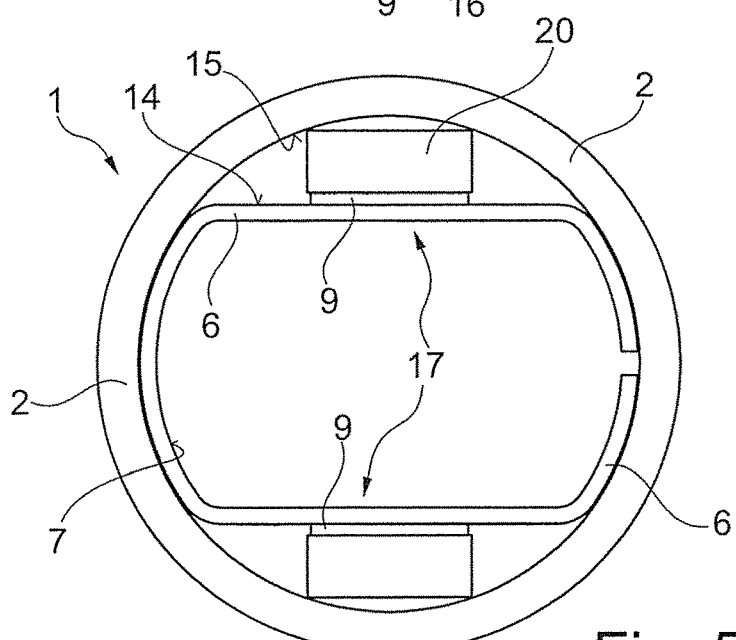
Figure 5B:
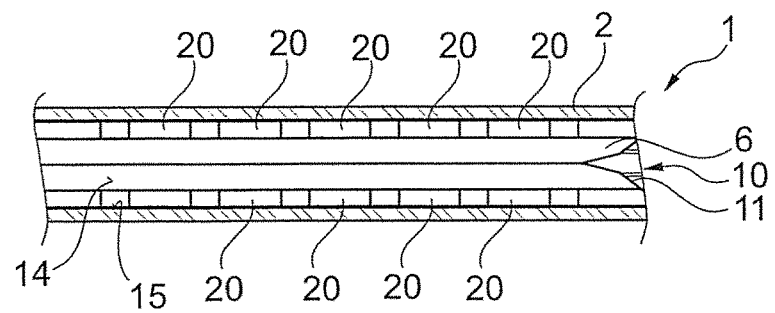

FIG. 5A shows a cross-section through a further exemplary embodiment of the spring contact pin 1 and FIG. 5B shows a longitudinal cross-section.

It is provided here that a plurality of the components 20 are arranged on the circuit carrier 6 for stiffening in the longitudinal direction of the circuit carrier 6 or the pin sleeve 2, respectively. These stiffening components 20 exert increased pressure on the sections 17 of the circuit carrier 6, which are particularly rigid then. Such a pressure is advantageous, for example, when using a grinder contact, which will be discussed in more detail later. In addition, large flat surfaces or rigid sections can be achieved, which are given a larger distance to the jacket of the pin sleeve 2 by larger components, as shown in FIG. 5A. The stiffening components 20 can also be applied to the circuit carrier in its original form using conventional assembly or coating technologies.

FIG. 6 shows a further exemplary embodiment of the spring contact pin 1 with a further design of the circuit carrier 6. While the pin sleeve 2 is of constant design, the circuit carrier 6 can be used to realize different shapes and functions. According to the exemplary embodiment in FIG. 6 it is provided that the circuit carrier 6 does not have a stadium-shaped cross-section, as in the previous exemplary embodiment, but a substantially triangular cross-section. This is achieved by the fact that three rows of stiffening components 20 are arranged on the side surface of the circuit carrier 6 facing the inside 15. FIG. 6A shows the spring contact pin 1 in a cross-sectional representation, while FIG. 6B shows the circuit carrier in a perspective partial representation. The circuit carrier 6 thus has a non-symmetrical structure with three flat or rigid sections 17, whereby the circuit carrier 6 is rolled or folded into the shape shown, as before when inserted into the pin sleeve 2, by deforming the remaining flexible areas. The rows of stiffening elements 20 extend in the longitudinal direction of the circuit carrier 6 or the pin sleeve 2, so that the substantially triangular cross-section is obtained.

In a further cross-sectional representation by the spring contact pin 1, FIG. 7 shows a further exemplary embodiment, in which the circuit carrier 6 is provided with at least two electrical/electronic components 18, which are arranged on an opposite side face 14 or 7 of the circuit carrier 6 facing away from one another. The components 18, viewed in cross-section, are arranged centrally on the circuit carrier 6 in its initial form. When inserted into the pin sleeve 2, the circuit carrier 6 is rolled up or folded in an S-shape, so that a rigid section 17 of the circuit carrier 6 with the components 18 as crosspiece results, which extends centrally or centered in the pin sleeve 2, viewed in cross-section. This means that the components 18 are arranged particularly far away from the pin sleeve 2 itself and are reliably protected from electrical contact with the pin sleeve 2 by the circuit carrier 6, which is made especially of plastic and extends over the components 18 due to its S-shape. This makes it possible, for example, to arrange one or more electrical/electronic components 18 in the middle, as seen from the cross-section.

For the production and assembly of the circuit carrier 6, it is provided in particular that the latter is produced in a panel consisting of a multitude of individual circuit carriers 6. The assembly of circuit carriers 6, for example with electrical/electronic SMD components 18, or the printing of circuit carrier 6 using thick-film technologies, for example, can be cost-effectively applied to the complete panel. A panel separation can be achieved by structures, which are already introduced during the production of the panel or the board, such as laser-cut perforations. It is also conceivable to subsequently separate the panel by cutting out or punching out individual circuit carriers or boards, for example also from auxiliary structures with a downstream separation process.

By specifically weakening the material of the respective circuit carrier 6 at the sections or regions, which are to be elastically or flexibly deformed later, in particular during insertion into the pin sleeve, the circuit carrier 6 can be given at least one preferred bending direction, which facilitates insertion into the round installation space of the pin sleeve 2 and relieves the stiff or rigid sections 17 of the circuit carrier 6 from overstretching or excessive deformations. It is also conceivable to provide bends or folds in the circuit carrier 6 that are not parallel to the longitudinal axis of the circuit carrier 6 or the pin sleeve 2. In this way, the respective circuit carrier 6, in its plate-shaped initial shape with a corresponding outer contour and defined free cuts, can be guided into a more complex three-dimensional structure by folding it before or during installation in pin sleeve 2. This will be discussed in more detail using the following example from FIG. 8.

FIG. 8 shows the step-by-step deformation of another exemplary embodiment of the circuit carrier 6, which is shown in FIG. 8 alone or without pin sleeve 2.

In a plate-shaped initial form, the circuit carrier 6 has a rectangular carrier section 21, from which a plurality of strip-shaped contact sections 22 extend parallel to one another. Conductor tracks 9 extend from the carrier section 21 to the contact sections 22. In the region of the carrier section 21, two electronic/electrical components 18 are arranged on the conductor tracks 9 and electrically contacted with them. The conductor track 9 are designed so as to be parallel to each other and the components 18 are arranged in such a way that the middle conductor track 9 is not covered by one of the components 18 and is therefore freely accessible. In order to avoid a short circuit during deformation due to electrical contact with the middle conductor track 9, it can be covered with an electrically insulating layer. According to the present exemplary embodiment, however, it is alternatively provided that a further strip-shaped section 22' starts from the carrier section 21, which extends in the direction opposite to the contact sections 22 from the carrier section 21 at the level of the middle conductor track 9. The length of the section 22' corresponds in particular to the length of the carrier section 21. In the transition from the carrier section 21 to the section 22', a material weakening is preferably provided, which allows the section 22' to be folded down onto the carrier section 21, as shown by an arrow in FIG. 8A.

Figure 8B:
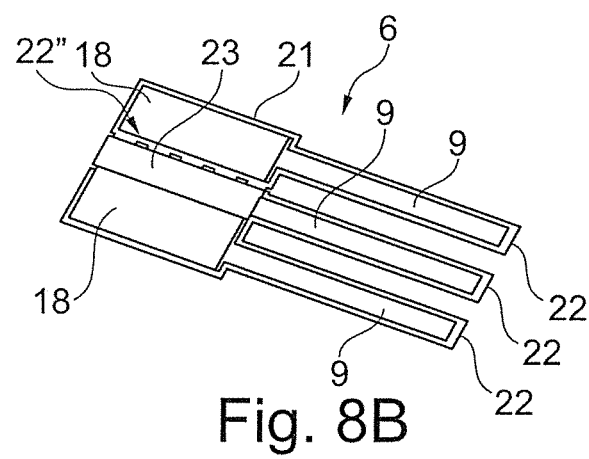

FIG. 8B shows the circuit carrier 6 after section 22' has been placed on the carrier section 21. The section 22' covers the middle path 9 in the area of the carrier section 21. Thus, the section 22' forms an insulating body for the electrical insulation of the middle path 9 with respect to the components 18, so that these cannot come into electrical contact with the middle path 9 during the subsequent deformation of the circuit carrier 6 into the target shape, as shown in FIG. 8C.

Figure 8C:
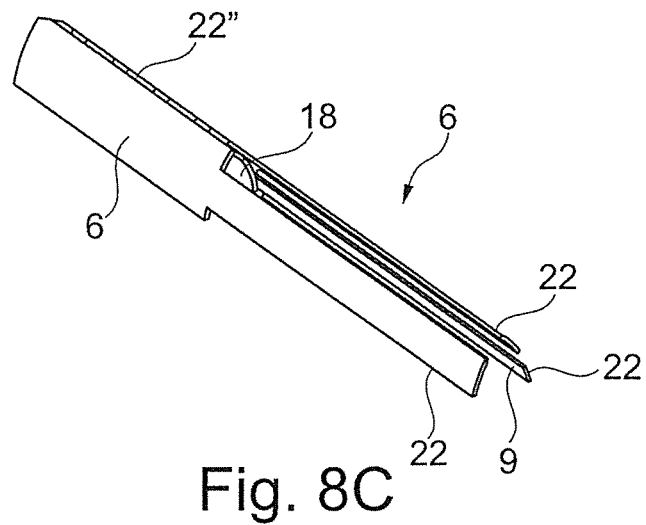

FIG. 8C shows the target shape of the circuit carrier 6, as it should be in the pin sleeve 2 when assembled. The circuit carrier 6 has been folded around a longitudinal bending axis (shown dashed), which is predetermined by a perforation 22" along the bending axis in the region of the carrier section 21 between two of the adjacent conductor tracks 9 or contact section 22, respectively. Here, too, the deformation or folding of the circuit carrier 6 can be achieved by automatically pushing it into the corresponding shape when it is inserted through the insertion chamfers 11, 12.

FIG. 9 shows another exemplary embodiment of the spring contact pin 1, in which the carrier section 21 is now circular and in the installed state is perpendicular to the longitudinal axis of the pin sleeve 2 or the spring contact pin 1. FIG. 9A shows a top view of the circuit carrier 6, which in addition to the circular carrier section 21 has two of the strip-shaped contact sections 22, which are arranged on diametrically opposite sides of the carrier section 21 according to this exemplary embodiment. While FIG. 9A shows a top view of the side surface 14, which later initially faces the inside 15 of the pin sleeve 2 in sections, FIG. 9B shows a top view of the side surface 7, on which two conductor tracks 9 are formed, each extending from the carrier section 21 into the contact sections 22. In carrier section 21, the conductor tracks 9 are electrically connected by two vias with two contact surfaces 8 on the side surface 14. An electrical/electronic component 18 is preferably arranged on the contact surfaces 8, as shown in FIG. 9C.

FIG. 9C further shows a cross-section through the spring contact pin 1, which shows that the carrier section 21 has an outer diameter, which is only slightly smaller than the inner diameter $D_2$ of the pin sleeve 2, so that the carrier section 21 can be arranged vertically in the pin sleeve 2, as shown in FIG. 9C.

FIG. 9D shows a longitudinal section representation through the pin sleeve 2 of the spring contact pin 1, from which it can be seen that the contact surface 22 lies at least substantially at a right angle to the carrier section 21 in the pin sleeve 2 after assembly and extends parallel to the inside 15 of the pin sleeve 2. Both contact sections 22 are bent in the same direction, so that they lie opposite one another in the pin sleeve 2, the conductor tracks 9 facing one another due to the folded switch carrier 6. On the side of carrier section 21 facing away from component 18, a stiffening component 20 which is larger than component 18 is preferred, which can of course also be electrically or electronically designed. This ensures that the carrier section 21 retains its shape, especially in order to be able to also absorb axial forces, such as an axially acting spring element, such as the spring element 5. The circuit carrier 6 is preferably integrated in the force flow between the spring element 5 and the pin sleeve 2 and is supported axially on the pin sleeve 2 against the spring force.

It is advantageous that the component 20 has a flattening and suspension on both sides, along which the contact sections 22 are guided past the component 20, as shown in particular in FIG. 9D.

According to another exemplary embodiment, shown in FIG. 10, it is provided that the spring contact pin 1 is designed as a switching contact pin. For this purpose, an electrically conductive contact element 23 is arranged in the guide end 4 of the test head 3 or in a holding element mechanically coupled to the guide end 4. In this case, the contact element 23 is designed as a spring element, whose spring force acts perpendicularly to the direction of sliding of the test head 3 and extends through the guide end 4 in a radial through opening, in particular through bore or cross bore 24. The contact element 23 projects radially beyond the guide end 4, so that its end contact surfaces 25 are radially pretensioned against the inside 15 of the pin sleeve 2 or the circuit carrier 6.

FIGS. 10B and 10A show a top view of the side surface 7 (FIG. 10B) and the side surface 14 (FIG. 10C) of the circuit carrier 6 of this spring contact pin 1. The circuit carrier 6 has on the side surface 7 a continuous conductor track 9' and an interrupted conductor track 9" which extend in the longitudinal direction of the circuit carrier 6 and each form a contact track 26. In addition, a contact surface 8 is arranged to the existing path 9' and 9"'. On the rear side or the side surface 14 of the circuit carrier 6, the conductor tracks 9', 9" are provided with electrical insulation, and a further electrical conductor track 9"' is formed so as to run between the conductor tracks 9' and 9", the conductor track 9" being electrically connected to the contact surface 8 by a via.

Thus, the switching function of the spring contact pin 1 is now performed between the contact tracks 26. When rolled up, these are opposite each other, as shown in FIG. 10A. The guide end 4 is designed to be inserted into the rolled-up circuit carrier 6, so that the contact element 23 is radially pretensioned against the circuit carrier 6, in particular its side surface 7. If the test head is now axially displaced due to contacting of a test object, as shown by a double arrow in FIG. 10A, the contact element 23 is moved along the contact track 26. Because the conductor track 9''' is interrupted, a switching function is implemented and a circuit is closed as soon as the contact element 23 electrically connects the conductor tracks 9''' and 9''. The interrupted areas of the conductor track 9''' are connected to a common conductor track on the rear side. The middle conductor track 9'', which creates an electrical contact to the pin sleeve 2 and thus to the test head, is optional. The contact element 23 consists in particular of a good electrical conductor.

Depending on the sliding position of the test head 3, the conductor tracks 9' and 9''' are thus electrically connected to or separated from each other. This way, a switching contact function of the spring contact pin 1 is easily implemented.

If the contact element 23 thus moves into an area in which the conductor tracks 9' and 9''' are electrically connected to each other, the switch is switched on or closed. If the switch moves into an area in which the contact element, on the one hand, lies against the conductor track 9' and, on the other hand, contacts the circuit carrier 6 made of plastic in the interrupted section of the conductor track 9''', an electrical contact is interrupted and the switch is thus switched off.

FIG. 11 shows an alternative exemplary embodiment of the spring contact pin 1 as a switching contact pin, in which, instead of a spring element as contact element 23, a ball grinder 27 is held braced between the test head 3 and the spring element 5. Here, an inherent elasticity of the circuit carrier 6 is used to ensure a permanent contact between the ball grinder 27 and the circuit carrier 6 via the restoring forces of the contact sections 22. The contact of the contact element 23 can thus be a rigid component, such as the ball grinder 27 shown in FIG. 11. Advantageously, the installation space in the pin sleeve 2 allows a radial clearance for the contact sections 22 of the circuit carrier 6.

The use of the rigid grinding wheel or contact element 23 can simplify the overall design. Preferably, the contact tracks 26 and the conductor tracks 9' and 9''' are coated for the remaining contacts in order to increase their service life and reduce wear. In addition to various galvanic processes, coatings applied using thick-film technology, for example on a carbon basis, are also suitable.

As an alternative to the design as a switching contact pin, the spring contact pin 1 is designed as a spring travel measuring sensor or linear potentiometer according to a further exemplary embodiment. In addition to the electrical contacting of the test head, this enables a statement to be made about the height or correct mounting of the test head. Possible applications include for example measuring pin lengths in connectors, the depth of blind holes, the presence of components and their height. In order to be able to record this, a further electrical signal is required, which allows conclusions to be drawn about the displacement of test head 3. A possible solution for this is the use of a variable electrical resistance, which changes according to the offset of the spring contact pin. This solution is basically state-of-the-art and is also referred to as a potentiometer.

An essential component of such a potentiometer is the formation of at least one of the contact tracks 26 as electrical resistance track 28, which is in contact with the contact element 23. The movement of the contact element 23 or grinding is determined by the movement of the test head 3. Due to the position of the contact element 23 on the resistance track 28, which extends along the longitudinal direction of the circuit carrier 6, a specific electrical resistance value is set, which is measured as an electrical quantity. If possible, the measurement is carried out as a voltage signal. To this end, a constant electrical voltage is preferably applied to the resistance track 28, which is picked up by the contact element 23 depending on its position. The resistance track is electrically contacted by two electrodes. In principle, it is preferred that the resistance track 28 is characterized by an electrical resistance value, which is considerably higher than that of the electrodes, so that a position-dependent characteristic curve results. Alternatively, the electrical resistance between the sliding contact and a resistance track 28 can be measured. The advantage here is that only two conductors are required for the measurement. The disadvantage is that the influence of additional electrical resistances, for example by cable connections, sliding contact on the resistance track and the like, can falsify the measurement result.

In one exemplary embodiment, FIG. 12 shows a conductor for the circuit carrier 6 as a linear potentiometer. FIG. 12A shows the rear side or the side surface 14 of the circuit carrier 6 facing the inside 15 in a top view. As in the previous exemplary embodiment, three parallel conductor tracks 9 are arranged on the circuit carrier 6, whereby the two outer conductor tracks 9' and 9''' are coated by an electrical insulation 16, and the middle conductor track 9'''' is exposed in order to be in electrical contact with the pin sleeve 2 in the mounted state.

FIGS. 12B and 12C show a top view of the side surface 7 of the circuit carrier 6. The outer conductor tracks 9 penetrate the side surface 7, so that—as shown in FIG. 10B—a continuous conductor track 9' and an interrupted conductor track 9''' is produced, whereby the conductor track 9''' is simply interrupted. The interrupted section is bridged by a resistance track 28, whereby the conductor track 9''' is also provided with a resistance track 28. One of the resistance tracks 28 is characterized by a much higher specific electrical resistance compared to conventional conductor tracks. In the exemplary embodiment shown in FIG. 12C, this is achieved by means of so-called sealing layer resistances. Such resistances are, for example, applied to the circuit carrier 6 by screen printing and hardened in a subsequent sintering or baking process. As an alternative to a sinter baking process, a drying process or a chemical reaction is also conceivable, through which a liquid/pasty medium of such thick films hardens. It is known that such resistance structures are made of plastic/polymer composites in order to be able to realize the correspondingly high electrical resistances.

In this case, one of these resistance tracks 28 is applied to the continuous conductor track 9', which is electrically connected to one of the contact surfaces 8. This resistance track 28 is known as the collector track here. The path-dependent signal is picked up at the contact surface 8 electrically connected to it. The thick-film resistor applied to the collector track is optional and has no electrical function, but serves to minimize the wear of the slider or the contact element 23. The actual resistance track 28 or contact track 26 is applied between the two metallic conductor track sections of the conductor track 9''', which are connected to two different contact surfaces 8. The electrical resistance which results/appears between the two contact surfaces 8 assigned to the resistance path 28 on the conductor track 9''' can be adjusted by the geometric shape of the resistance track 28, in particular thickness, width and length, as well as its electrical properties, in particular specific conductivity, of the resistance paste applied. In principle, the electrical resistance should be selected as the electrical resistance of the lines to this resistance, for example greater than 5 kΩ. If the collector track is now contacted with the resistance track by a contact element, for example as shown in FIG. 10A, a measuring signal can be determined from which the insertion depth of the test head 3 into the pin sleeve 2 can be determined.

FIG. 13 shows a further exemplary embodiment of the spring contact pin 1, in which an optical component, in particular an illuminant or an optoelectronic component, is used as the electrical/electronic component. By integrating optoelectronic components, the technology can be used to create a useful interface to optical fibers both as a receiver using a photodiode or as a transmitter using a light source, such as a light-emitting diode. The primary function of the spring contact pin 1 is then the conversion of the light signal into an electrical signal or an electrical impulse into an optical signal (transmitter) in the contacting of the optical waveguide to be tested as a test object FIGS. 13A, 13B, 13C and 13D show the exemplary step-by-step construction of the circuit carrier 6. FIG. 13A shows a top view of the rear side or the side surface 7 of the circuit carrier 6, with a continuously electrically insulated conductor track 9. FIGS. 13B to 13D show a top view of the front side or the side surface 14. The conductor track 9 is interrupted, as shown in particular in FIG. 13B. In the following manufacturing step, the free conductor track ends are tin-plated. Finally, as shown in FIG. 13D, electrical/electronic components 18 and 29 are applied to the tin-plated sections bridging the interruptions and electrically contacted. Component 18, for example, is an electrical resistor or passive SMD component, and component 29, as mentioned earlier, is an optical component, in particular an opto-electronic converter.

When inserted into pin sleeve 2, as shown in FIG. 13E as an example, the circuit carrier 6 is rolled up, as described above, so that component 29 lies inside pin sleeve 2.

In addition to transmitting data by means of an optical signal, this structure with a light source as a component can also be used to send an optical signal to a human/user. Such a signal is useful, for example, in a manual assembly in which an electrical test is carried out immediately after assembly. In addition to electronic components 18, 29, optical components, such as lenses, can also be mounted on the circuit carrier 6 before mounting in the pin sleeve 2. In principle, it is also advantageous here to attach such components to the circuit carrier 6, if they are still in use. It is also conceivable to carry out a similar assembly process as for SMD components, in which case adhesive is used instead of solder. For the application of adhesives, already known technologies can be used for the production of printed circuit boards. In addition to optically functional components, it can also be useful to attach other electronic components to the printed circuit board. For example, it is advantageous to provide a series-connected electrical resistor, as suggested in FIG. 13B, for a LED light source. This has the advantage that the spring contact pin guarantees a reliable measurement result in terms of accuracy and constancy even with a lower-quality electrical power supply. Passive electronic components for a receiver, consisting of a photodiode, can be capacitors and electrical resistors, for example, which are connected in series or parallel to the respective sensor on the circuit carrier 6 in order, for example, to implement an electrical filter against interfering influences on the signal.

FIG. 14 shows a further exemplary embodiment of the spring contact pin 1, which differs from the previous exemplary embodiments in that the pin sleeve 2 connects a first section 2' with the inner diameter $D_2$ and a second section 2" axially adjacent thereto with a smaller inner diameter $d_z$. In the transition from the first section 2" to the second section 2", a wedge-shaped or conical insertion chamfer 30 is formed.

The circuit carrier 6 also has two sections 6' and 6", the circuit carrier 6 having the width $B_6$ in the first section 6' and a width $B_6$ in the second section 6" which is smaller than the width $B_6$ in the first section 6'. In the first section 6', the circuit carrier 6 is formed according to the exemplary embodiment of FIG. 10B. In the second section 6", the circuit carrier 6 forms a strip-shaped contact section with several conductor tracks 9, which forms a terminal plug 32 at its free end.

Section 6" is characterized by high rigidity, while the 6' section has high flexibility. Vis-à-vis the end area of section 6" facing section 6', section 6" is also flexibly deformable, so that a transition from a deformed first section 6' to the substantially rigid second section 6" is possible. For stiffening section 6', printed circuit board structures such as metal coatings or solder resist are also used here. In addition, one or more of the stiffening components 20 can be used and glued onto the circuit carrier 6, for example. The stiffening components 20 are preferably also produced in one panel and are also separated from their panel when the circuit carrier 6 is separated.

Figure 14A:
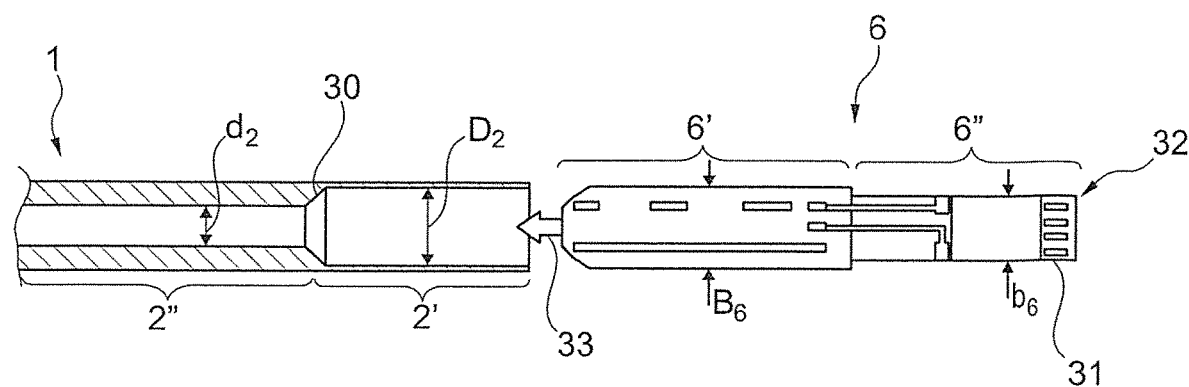

If the circuit carrier 6 is inserted into the pin sleeve 2, as shown in FIG. 14A by an arrow 33, the first section 6' of the circuit carrier 6 is rolled into the second section 2" of the pin sleeve 2 with the smaller diameter $d_2$ and placed against the inside 14 of the jacket wall or pin sleeve 2. In section 6", which then lies in section 2', there is no deformation of the circuit carrier 6, because in section 6" it has a width $B_6$ which is smaller than the inner diameter $D_2$.

Figure 14B:
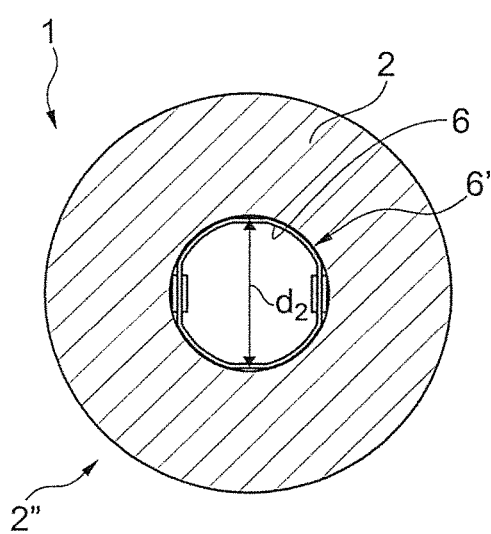
Figure 14C:
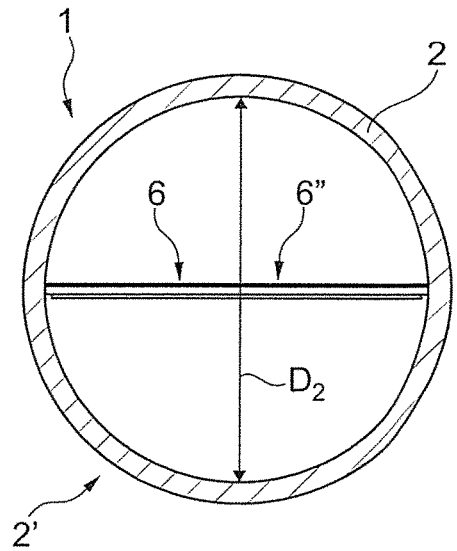
Figure 14D:
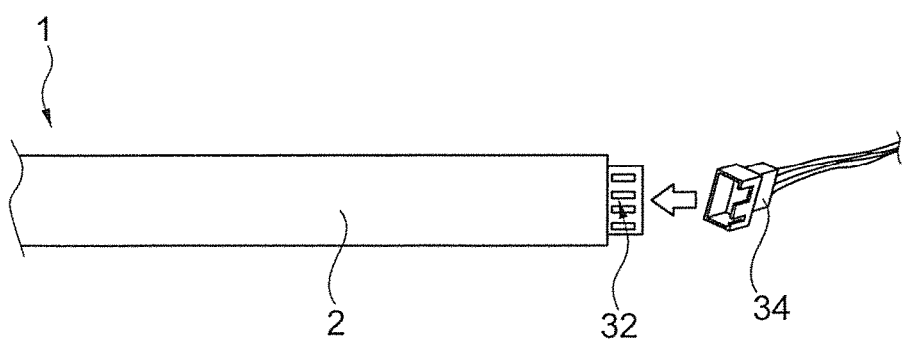

FIG. 14B shows a cross-sectional representation of the spring contact pin 1 in the section of the second section 2" and FIG. 14C shows a cross-sectional representation of the spring contact pin 1 in the section 2'. Here, it is readily apparent that in section 2" the circuit carrier 6 is deformed or rolled up and in section 2' it is stiff/rigid and flat. FIG. 14D shows the end position of the circuit carrier 6 in the pin sleeve 2 in a side view, the circuit carrier 6 being designed in such a way that the terminal plug 32 projects from the free end of the pin sleeve 2, so that it can be electrically contacted by a contact plug 34, which is pushed onto the terminal plug 32. The contact plug 34 is, for example, designed as a ZIF plug, so that electrical contacting of the switch plate 6 is possible without soldering. Optionally, the contact plug 32 can be raised by one or more stiffening elements or structures on the circuit carrier 6 in the area of section 6".

The invention claimed is:
1. A contact pin comprising:
 a test head for contacting an electrically conductive contact surface of a test object;
 a pin sleeve, in which the test head is mounted with a guide end in a longitudinally displaceable manner, and
 a circuit carrier which is at least in sections flexibly deformable, the circuit carrier has at least one rigid conductor track on a side face facing an inside of the pin sleeve, whereby at least one electrical/electronic component is arranged on the circuit carrier, and whereby the circuit carrier is axially inserted into the pin sleeve by rolling and/or folding,
wherein the contact pin is a spring contact pin.

2. The contact pin according to claim 1, wherein the circuit carrier at least in sections has an inherent elasticity, such that the circuit carrier is pretensioned against an inner side of the pin sleeve at least in certain areas by the inherent elasticity in the pin sleeve.

3. The contact pin according to claim 2, wherein the circuit carrier has at least one electrically conductive surface which is pretensionable against the inner side of the pin sleeve.

4. The contact pin according to claim 1, wherein the circuit carrier includes at least one rigid section, the electrical/electronic component arranged on one of the at least one rigid section.

5. The contact pin according to claim 4, wherein at least one rigid section of the circuit carrier is arranged at a distance from an inner side of the pin sleeve.

6. The contact pin according to claim 1, wherein the circuit carrier has an electrically insulating layer at least in sections on a side face of the circuit carrier facing an inner side of the pin sleeve.

7. The contact pin according to claim 1, wherein the circuit carrier is rolled up/rollable and/or folded/foldable in a circular, triangular or S-shaped manner.

8. The contact pin according to claim 1, wherein the circuit carrier has a circular, rigid carrier section, from which at least one strip-shaped contact section emanates, which is alignable perpendicular to the carrier section by folding the circuit carrier so as to lie at least substantially parallel to a longitudinal direction of the pin sleeve in the pin sleeve, and wherein the carrier section has an outer diameter which is smaller than an inner diameter of the pin sleeve.

9. The contact pin according to claim 8, wherein the contact section has at least one electrically conductive conductor track on a side face facing away from an inner side of the pin sleeve.

10. The contact pin according to claim 1, wherein the circuit carrier forms a structure for a printed circuit board plug-in connection at a free end.

11. The contact pin according to claim 10, wherein a contact section of the circuit carrier forms the structure for the printed circuit board plug-in connection.

12. The contact pin according to claim 1, wherein the circuit carrier has at least one first insertion chamfer, through which the circuit carrier is rolled during insertion into the pin sleeve or is at least supported.

13. The contact pin according to claim 1, wherein the pin sleeve has at least a second insertion chamfer at an axially open end, through which the circuit carrier is insertable into the pin sleeve.

14. The contact pin according to claim 1, wherein the circuit carrier has at least one contact track extending in a longitudinal direction of the pin sleeve for forming a switch contact pin or a linear potentiometer, which can be contacted electrically in at least one sliding position of the test head relative to the pin sleeve by a contact element which can be displaced in the pin sleeve by the test head.

15. The contact pin according to claim 14, wherein the contact element includes at least one spring element which pretenses a contact surface of the contact element radially for contacting the at least one contact track.

16. The contact pin according to claim 14, wherein the at least one contact track is a resistance track.

17. The contact pin according to claim 1, wherein the at least one electrical/electronic component is selected from a group consisting of an optoelectronic component, an illuminant, a sensor and an electrical resistor.

* * * * *